US010396507B2

(12) United States Patent
Vaccaro

(10) Patent No.: US 10,396,507 B2
(45) Date of Patent: Aug. 27, 2019

(54) COAXIAL CONNECTOR WITH AXIAL AND RADIAL CONTACT BETWEEN OUTER CONDUCTORS

(71) Applicant: CommScope Technologies LLC, Hickory, NC (US)

(72) Inventor: Ronald A. Vaccaro, Taylorsville, NC (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/926,232

(22) Filed: Mar. 20, 2018

(65) Prior Publication Data

US 2018/0277997 A1 Sep. 27, 2018

Related U.S. Application Data

(63) Continuation of application No. 15/394,884, filed on Dec. 30, 2016, now Pat. No. 9,923,314, which is a (Continued)

(51) Int. Cl.
*H01R 24/38* (2011.01)
*H01R 9/05* (2006.01)

(Continued)

(52) U.S. Cl.
CPC ............... *H01R 24/38* (2013.01); *H01R 4/48* (2013.01); *H01R 4/60* (2013.01); *H01R 9/0503* (2013.01);

(Continued)

(58) Field of Classification Search
CPC ........ H01R 9/05; H01R 9/0524; H01R 13/59; H01R 24/38

(Continued)

(56) References Cited

U.S. PATENT DOCUMENTS 8,506,325 B2 8/2013 Malloy et al.
9,039,446 B2 5/2015 Youtsey (Continued)

FOREIGN PATENT DOCUMENTS

KR 20000056933 9/2000
KR 20080002099 6/2008

(Continued)

OTHER PUBLICATIONS

KR101097281_trans.*

(Continued)

*Primary Examiner* — Tulsidas C Patel
*Assistant Examiner* — Marcus E Harcum
(74) *Attorney, Agent, or Firm* — Myers Bigel, P.A.

(57) ABSTRACT

An assembly of mated coaxial connectors includes: a first connector with a first central conductor extension and a first outer conductor extension having a free end portion; and a second connector with a second central conductor extension and a second outer conductor extension having an outer body and an inner body with a gap therebetween. The first central conductor extension engages the second central conductor extension. The free end portion of the first outer conductor extension fits within the gap of the second outer conductor extension, such that the inner body applies radially outward pressure to the first outer conductor extension. At least one of the first outer conductor extension and the second outer conductor extension includes a flex member that deflects during axial engagement of the first and second connectors to apply axial pressure to the other of the first outer conductor extension and the second outer conductor extension.

7 Claims, 4 Drawing Sheets

Related U.S. Application Data continuation of application No. 14/594,727, filed on Jan. 12, 2015, now Pat. No. 9,570,819.

(60) Provisional application No. 61/926,638, filed on Jan. 13, 2014.

(51) Int. Cl.

| | |
|---|---|
| ***H01R 13/24*** | (2006.01) |
| ***H01R 24/54*** | (2011.01) |
| ***H01R 4/48*** | (2006.01) |
| ***H01R 4/60*** | (2006.01) |
| *H01R 13/622* | (2006.01) |
| *H01R 103/00* | (2006.01) |

(52) U.S. Cl.

CPC ............. *H01R 13/24* (2013.01); *H01R 24/54* (2013.01); *H05K 999/99* (2013.01); *H01R 13/622* (2013.01); *H01R 2103/00* (2013.01)

(58) Field of Classification Search

USPC ................................. 439/578, 583, 584, 675

See application file for complete search history.

(56) References Cited

U.S. PATENT DOCUMENTS

| | | | |
|---|---|---|---|
| 9,153,911 | B2 | 10/2015 | Burris et al. |
| 2002/0037669 | A1 | 3/2002 | D'Addario |
| 2006/0051997 | A1 | 3/2006 | Kooiman |
| 2006/0099853 | A1 | 5/2006 | Sattele et al. |
| 2008/0254668 | A1 | 10/2008 | Rosenberger |
| 2009/0181575 | A1 | 7/2009 | Hung |
| 2009/0264003 | A1 | 10/2009 | Hertzler et al. |
| 2010/0261382 | A1 | 10/2010 | Montena et al. |
| 2011/0130048 | A1 | 6/2011 | Haunberger et al. |
| 2012/0129387 | A1 | 5/2012 | Holland et al. |
| 2014/0162493 | A1 | 6/2014 | Lu |
| 2014/0235099 | A1 | 8/2014 | Burris et al. |
| 2014/0273620 | A1 | 9/2014 | Burris |

FOREIGN PATENT DOCUMENTS

| | | | |
|---|---|---|---|
| KR | 20110082487 | | 7/2011 |
| KR | 101097281 | | 12/2011 |
| KR | 101097281 | B1 * | 12/2011 |
| WO | 2011/019987 | A1 | 2/2011 |

OTHER PUBLICATIONS

International Search Report and Written Opinion for corresponding PCT application No. PCT/US2015/010958, dated Apr. 23, 2015.

Extended European Search Report corresponding to European Application No. 15734854.1 dated Jul. 24, 2017.

Office Action corresponding to Chinese Application No. 201580004399.3 dated Nov. 16, 2017.

* cited by examiner

COAXIAL CONNECTOR WITH AXIAL AND RADIAL CONTACT BETWEEN OUTER CONDUCTORS

RELATED APPLICATION

This application is a continuation application of and claims priority to U.S. patent application Ser. No. 15/394,884, filed Dec. 30, 2016, now U.S. Pat. No. 9,923,314, which is a continuation of and claims priority to U.S. patent application Ser. No. 14/594,727, filed Jan. 12, 2015, now U.S. Pat. No. 9,570,819, which claims priority from and the benefit of U.S. Provisional Patent Application No. 61/926,638, filed Jan. 13, 2014, the disclosures of which are hereby incorporated herein in their entirety.

FIELD OF THE INVENTION

The present application is directed generally to electrical cable connectors, and more particularly to coaxial connectors for electrical cable

BACKGROUND OF THE INVENTION

Coaxial cables are commonly utilized in RF communications systems. A typical coaxial cable includes an inner conductor, an outer conductor, a dielectric layer that separates the inner and outer conductors, and a jacket that covers the outer conductor. Coaxial cable connectors may be applied to terminate coaxial cables, for example, in communication systems requiring a high level of precision and reliability.

Coaxial connector interfaces provide a connect/disconnect functionality between a cable terminated with a connector bearing the desired connector interface and a corresponding connector with a mating connector interface mounted on an apparatus or on another cable. Typically, one connector will include a structure such as a pin or post connected to an inner conductor and an outer conductor connector body connected to the outer conductor; these are mated with a mating sleeve (for the pin or post of the inner conductor) and another outer conductor connector body of a second connector. Coaxial connector interfaces often utilize a threaded coupling nut or other retainer that draws the connector interface pair into secure electro-mechanical engagement when the coupling nut (which is captured by one of the connectors) is threaded onto the other connector.

A new proposed 4.3/10 interface under consideration by the IEC (46F/243/NP) (hereinafter the 4.3/10 interface) is alleged to exhibit superior electrical performance and improved (easier) mating. The 4.3/10 interface includes the following features: (a) separate electrical and mechanical reference planes; and (b) radial (electrical) contact of the outer conductor, so that axial compression is not needed for high normal forces. An exemplary configuration is shown in FIG. 1 and is described in detail below. The alleged benefits of this arrangement include:

- Increased mechanical stability, as the mechanical reference plane is now outside the RF path;
- Non-bottoming of the electrical reference plane (as contact is made in the radial direction)—therefore, normal (radial) forces are independent from coupling nut torque applied;
- Coupling nut torque reduction;
- Improvement in PIM performance as outer contact radial forces are independent of coupling nut torque applied; and
- Gang mating of several connectors as the electrical reference plane can float (axially). Therefore, tolerance stack-ups from connector to connector should have no effect.

It may be desirable to provide connector designs that conform to the proposed 4.3/10 interface standard.

SUMMARY

As a first aspect, embodiments of the invention are directed to an assembly of mated coaxial connectors. The assembly comprises: a first connector having a first central conductor extension and a first outer conductor extension, the first outer conductor extension having a free end portion; and a second connector having a second central conductor extension and a second outer conductor extension, the second outer conductor extension having an outer body and an inner body with a gap therebetween. The first central conductor extension engages the second central conductor extension to establish a first electrical connection. The free end portion of the first outer conductor extension fits within the gap of the second outer conductor extension, such that the inner body applies radially outward pressure to the first outer conductor extension to establish a second electrical connection. At least one of the first outer conductor extension and the second outer conductor extension includes a flex member that deflects during axial engagement of the first and second connectors to apply axial pressure to the other of the first outer conductor extension and the second outer conductor extension to augment the second electrical connection.

As a second aspect, embodiments of the invention are directed to an assembly of mated coaxial connectors, comprising: a first connector having a first central conductor extension and a first outer conductor extension, the first outer conductor extension having a free end portion; a second connector having a second central conductor extension and a second outer conductor extension, the second outer conductor extension having an outer body and an inner body with a gap therebetween; and a coupling nut that engages the first outer conductor extension. The first central conductor extension engages the second central conductor extension to establish a first electrical connection. The free end portion of the first outer conductor extension fits within the gap of the second outer conductor extension, such that the inner body applies radially outward pressure to the first outer conductor extension to establish a second electrical connection. At least one of the first outer conductor extension and the second outer conductor extension includes a flex member that deflects during axial engagement of the first and second connectors to apply axial pressure to the other of the first outer conductor extension and the second outer conductor extension to augment the second electrical connection. The coupling nut engages the outer body of the second outer conductor extension but does not engage a free end of the outer body of the second outer conductor extension.

As a third aspect, embodiments of the invention are directed to an assembly of mated coaxial connectors, comprising: a first connector having a first central conductor extension and a first outer conductor extension, the first outer conductor extension having a free end portion; and a second connector having a second central conductor extension and a second outer conductor extension, the second outer conductor extension having an outer body and an inner body with a gap therebetween. The first central conductor extension engages the second central conductor extension to establish a first electrical connection. The free end portion of the first outer conductor extension fits within the gap of the second outer conductor extension, such that the inner body applies radially outward pressure to the first outer conductor extension to establish a second electrical connection. Engagement of the first outer conductor extension and the inner body of the second outer conductor extension induces deflection in at least one of the first outer conductor extension and the inner body to create axial and radial pressure between the first outer conductor extension and the inner body.

DETAILED DESCRIPTION

The present invention is described with reference to the accompanying drawings, in which certain embodiments of the invention are shown. This invention may, however, be embodied in many different forms and should not be construed as limited to the embodiments that are pictured and described herein; rather, these embodiments are provided so that this disclosure will be thorough and complete, and will fully convey the scope of the invention to those skilled in the art. It will also be appreciated that the embodiments disclosed herein can be combined in any way and/or combination to provide many additional embodiments.

Unless otherwise defined, all technical and scientific terms that are used in this disclosure have the same meaning as commonly understood by one of ordinary skill in the art to which this invention belongs. The terminology used in the above description is for the purpose of describing particular embodiments only and is not intended to be limiting of the invention. As used in this disclosure, the singular forms “a”, “an” and “the” are intended to include the plural forms as well, unless the context clearly indicates otherwise. It will also be understood that when an element (e.g., a device, circuit, etc.) is referred to as being “connected” or “coupled” to another element, it can be directly connected or coupled to the other element or intervening elements may be present. In contrast, when an element is referred to as being “directly connected” or “directly coupled” to another element, there are no intervening elements present.

Figure 1:
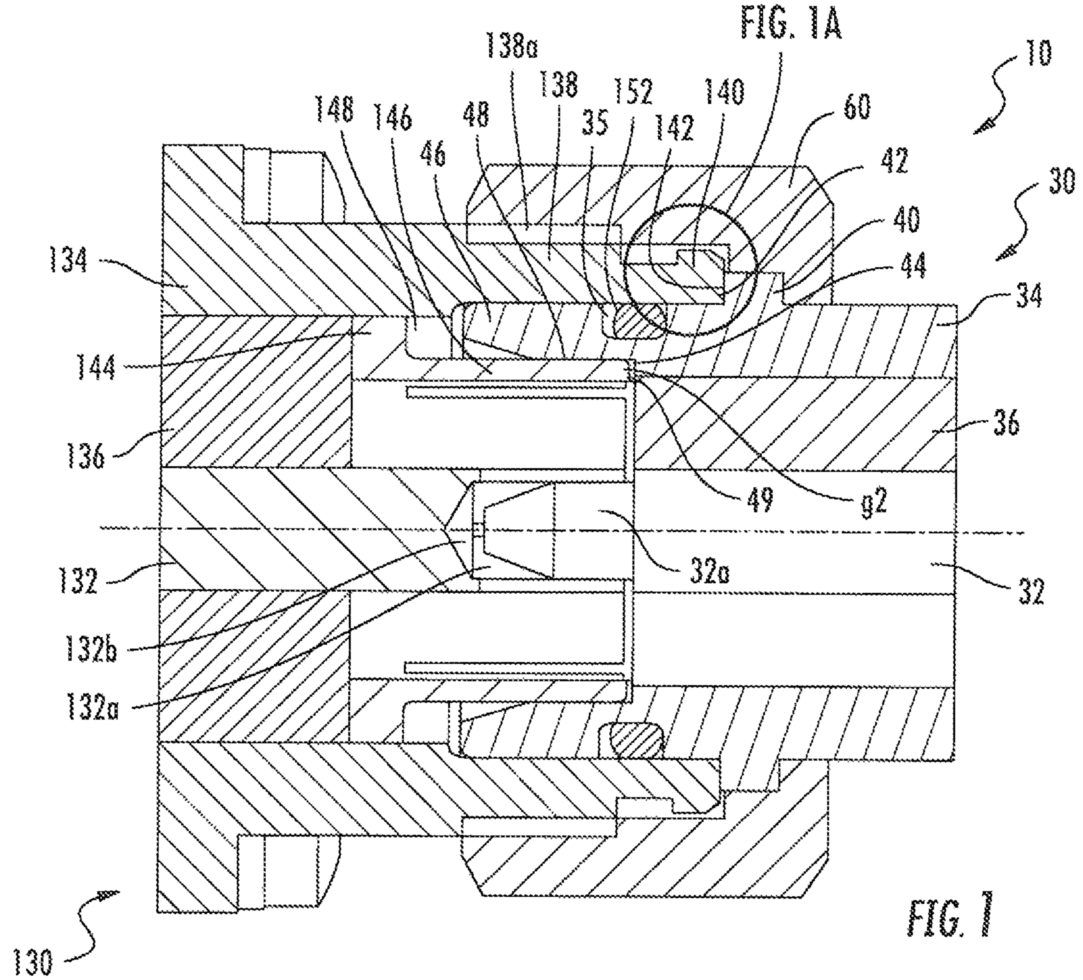
FIG. 1 is a section view of a mated assembly of two coaxial connectors according to the prior art.

Referring now to FIG. 1, a cross-section of a basic 4.3/10 interface configuration is shown therein and is designated broadly at 10. The interface 10 includes a plug 30 that is to be connected with a mating jack 130 of the mating coaxial cable. FIG. 1 shows the plug 30 and jack 130 in their mated condition.

The plug 30 includes a central conductor extension 32, an outer conductor extension 34, and a dielectric spacer 36. The central conductor extension 32 has a generally cylindrical post 32*a* with a conical free end and is configured to be attached at its opposite end to the center conductor of a coaxial cable (not shown). Similarly, the outer conductor extension 34 is configured to be mounted in electrical contact with the outer conductor of a coaxial cable (not shown). The free end portion 46 of the outer conductor extension 34 is bevelled to facilitate insertion of the jack 130. The outer conductor extension 34 also includes a radially-extending shoulder 40 with a bearing surface 42 that faces the jack 130. The outer conductor extension 34 also includes a recess 44 on its radially-inward surface that provides a surface 48 that faces the jack 130. The dielectric spacer 36 (which is annular in shape) is positioned between the central conductor extension 32 and the outer conductor extension.

Referring again to FIG. 1, the jack 130 includes a central conductor extension 132, an outer conductor extension 134, and a dielectric spacer 136. The central conductor extension 132 is configured to be mounted to and in electrical contact with the central conductor of a second coaxial cable. The central conductor extension 132 is hollow at its free end, forming a cavity 132*a* with a bevelled end 132*b*. The outer conductor extension 134 is configured to be mounted to and in electrical contact with the outer conductor of the aforementioned second coaxial cable. The outer conductor extension 134 includes an outer body 138 with a free end portion 140. The free end portion 140 includes a bearing surface 142. The outer conductor extension 134 also includes an inner body 144 that is positioned radially inwardly from the outer body 138 and abuts the dielectric spacer 136. Fingers 146 extend away from the inner body 144 toward the plug 30, such that a gap 148 is formed between the fingers 146 and the free end portion 140 of the outer body 138. The dielectric spacer 136 is positioned between the central conductor extension 132 and the outer conductor extension 134.

An O-ring 152 is located within an annular recess 35 in the outer conductor extension 34 to provide a seal to the interface when the plug 30 and jack 130 are mated. Also, a coupling nut 60 is captured by the shoulder 40 of the outer conductor extension 34 and mates with threads 138*a* on the outer body 138 of the outer conductor extension 134 to secure the mated plug 30 and jack 130.

Referring still to FIG. 1, when the plug 30 and jack 130 are mated, the post 32*a* is inserted into the cavity 132*a* to establish an electrical connection therebetween. Also, the free end 46 of the outer conductor extension 34 is inserted into the gap 148 of the outer conductor extension 134 to establish an electrical connection therebetween. More specifically, electrical connection is established between the fingers 146 of the inner body 144 and the radially inward surface of the free end portion 46 of the outer conductor extension 34. The gap 148 and free end 46 are sized such that insertion of the free end 46 therein causes the fingers 146 to flex radially inwardly, thereby exerting radially outward pressure on the inner surface 48 of the free end portion 46 to establish an electrical connection.

Figure 1A:
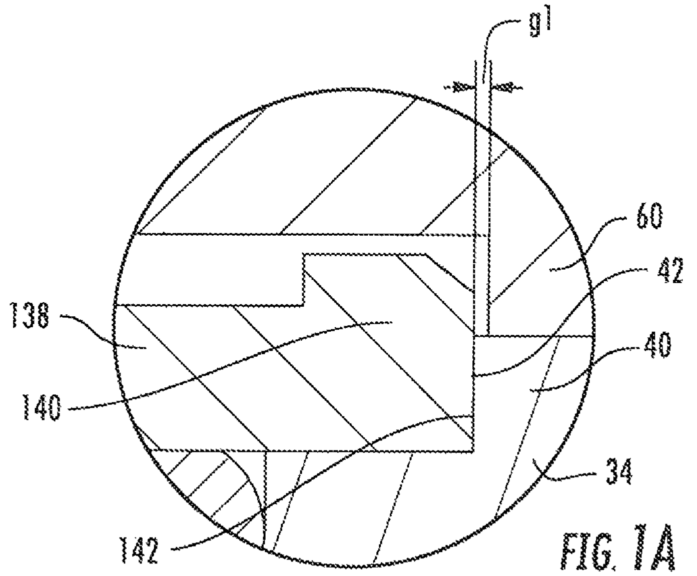
FIG. 1A is a greatly enlarged view of a portion of FIG. 1 showing the interaction of the outer body of the outer conductor extension of one connector and the shoulder of the outer conductor extension of the second connector.

Notably, when the plug 30 and jack 130 are mated, the bearing surface 142 of the free end 140 of the outer body 138 contacts the bearing surface 42 of the shoulder 40 of the outer conductor extension 34, but does not contact the coupling nut 60, which is prevented from further movement toward the jack 130 by the shoulder 40. As can be seen in FIG. 1A, this arrangement causes a gap g1 between the coupling nut 60 and the free end 140 of the outer body 138, such that the mechanical "stop" (sometimes called the "mechanical reference plane") is created by the bearing surface 142 and the bearing surface 42. As a result, and as can be seen in FIG. 1, a small gap g2 exists between the free ends of the fingers 146 and the surface 49 of the recess 44 of the outer conductor extension 34. The presence of this gap g2 indicates that electrical contact between the fingers 146 and the free end portion 46 of the outer conductor extension 34 is established by radial, not axial, contact between these components, and that the "electrical reference plane" created by such contact is offset from the mechanical reference plane described above. This arrangement is consistent with the specifications set forth for 4.3/10 interfaces.

However, such an arrangement may also be subject to increased Passive Interconnection Modulation (PIM), which is a form of electrical interference/signal transmission degradation that may occur with less than symmetrical interconnections and/or as electro-mechanical interconnections shift or degrade over time. Interconnections may shift due to mechanical stress, vibration, thermal cycling, and/or material degradation. PIM can be an important interconnection quality characteristic, as PIM generated by a single low quality interconnection may degrade the electrical performance of an entire RF system.

The lack of axial compression at the electrical reference plane is a potential PIM generator. The radial flex of the fingers of the outer conductor is unsupported by any secondary member that can help to stabilize the structure. Also, low coupling nut torque and solely radial compression may allow micro-movement of the fingers 146 during dynamic loading (e.g. wind, vibration, etc) that will degrade PIM performance.

Figure 2:
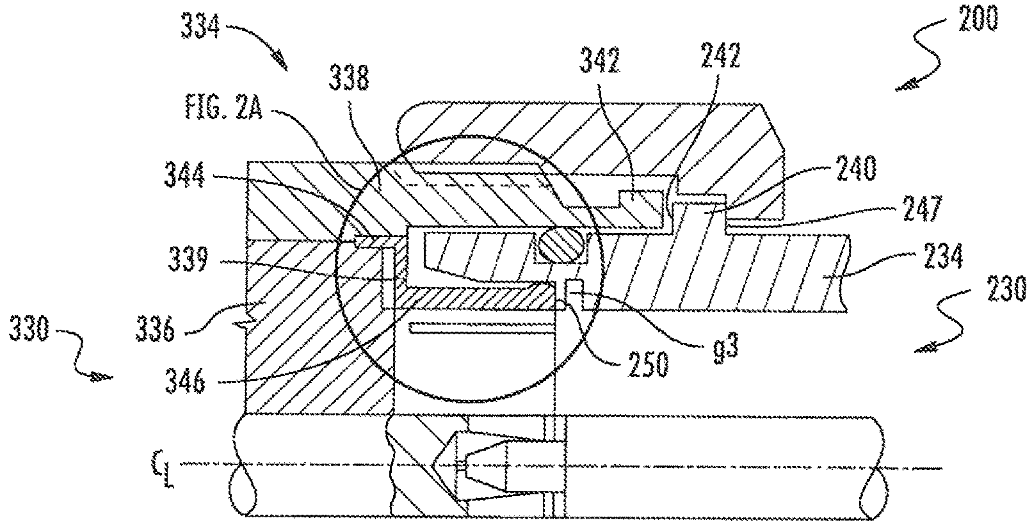
FIG. 2 is a partial section view of a mated assembly of two coaxial connectors according to embodiments of the present invention.
Figure 2A:
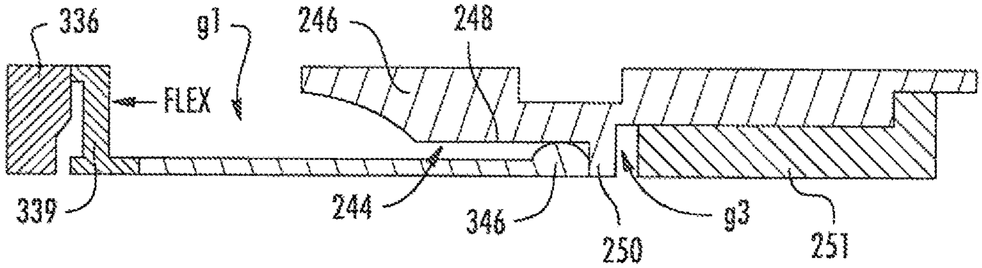
FIG. 2A is an enlarged view of a portion of the assembly of FIG. 2.

To address these potential shortcomings, an alternative configuration, comprising a plug 230 and a jack 330 and designated broadly at 200, is shown in FIGS. 2 and 2A. Much of the structure of the plug 230 and the jack 330 is similar to that shown in FIG. 1. Accordingly, the components in FIG. 2 use the same numbering scheme as is used in FIG. 1, except that "200" is added to each reference number in FIGS. 2 and 2A. In many cases, the components in FIG. 2 are identical to their corresponding components in FIG. 1. The discussion that follows focuses on the differences between the connectors of FIGS. 1 and 1A and the connectors of FIGS. 2 and 2A.

As shown in FIG. 2, the outer conductor extension 234 of the plug 230 includes a projection 250 that extends radially inwardly from the surface 248 of the recess 244, and a portion of the outer conductor extension 234 is receded from the projection 250 to form a gap g3 (the portion of the outer conductor extension 234 that is receded from the projection may be provided as a separate component 251 as shown in FIG. 2A). Also, the surface 247 of the shoulder 240 that serves as a bearing surface for the plug 230 is receded somewhat from its position in the plug 30. Further, in its relaxed condition, the inner body 344 of the outer conductor extension 334 of the jack 330 does not abut the dielectric spacer 336, but instead includes a radially-extending flex section 339 that is spaced from the dielectric spacer 336 to which the fingers 346 are mounted.

As can be seen in FIGS. 2 and 2A, when the plug 230 is mated in axial engagement with the jack 330, such that the free end 246 of the outer conductor extension 234 enters the gap g1, the fingers 346 of the inner body 339 contact the surface 248 of the recess 244, but also contact the projection 250 of the outer conductor extension 234 prior to any contact between the free end portion 342 of the outer body 338 of the outer conductor extension 334 with the surface 242 of the shoulder 240. The mated configuration "bottoms out" when the projection 250 flexes to the other side of the gap g3 and the flex section 339 contacts the dielectric spacer 336. Even when "bottomed out," the free end portion 342 of the outer body 338 of the outer conductor extension 334 does not axially engage the surface 242 of the shoulder 240. Thus, the mechanical reference plane is established at the contact point between the free ends of the fingers 346 and the projection 250. Because either or both of the projection 250 and the flex section 339 can deflect or flex in response to such contact, an axial component to the electrical connection between the outer conductor extensions 234, 334 is provided as well as the radial component provided by the fingers 346 on the recess 244 of the outer conductor extension 234. As a result, the mechanical and electrical planes are substantially coincident.

The configuration illustrated can enable each reference plane (in the plug and jack) to be axially compressible (possibly as much as 0.5-0.8 mm in each interface). Therefore, axial misalignment is still allowed, which can facilitate easy gang mating for several connectors. Axial compression of the outer conductor extensions 234, 334 is accomplished while maintaining radial compression. This combined loading of the outer conductor extensions 234, 334 may improve PIM performance over radial compression alone, as the system may be stabilized by this collective loading.

Those of skill in this art will appreciate that, in some assemblies, only one flex member may be present, and that the flex member may be included in either of the plug 230 or the jack 330.

Figure 3:
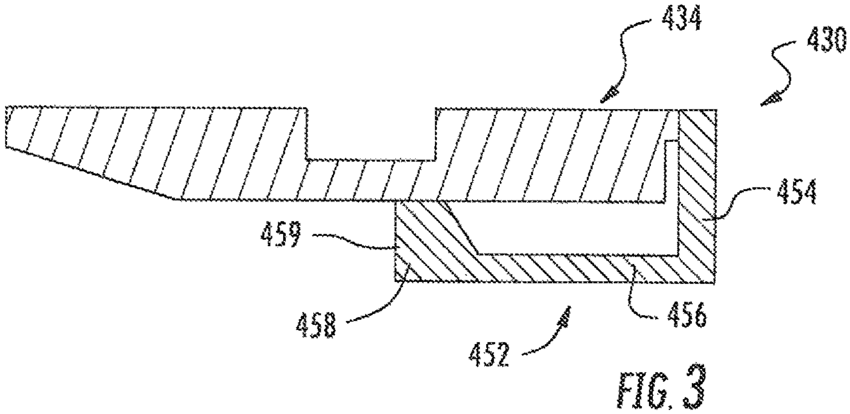
FIG. 3 is a partial section view of one coaxial connector according to embodiments of the present invention.

Another configuration of a plug 430 for mating with the jack 330 is shown in FIG. 3. The plug 430 varies from the plug 230 discussed above in that the projection 250 is replaced with a generally U-shaped flex member 452 having a radially-extending flex section 454 attached to the outer conductor extension 434, a body 456 and a stop 458 at the free end of the body 456. The stop 458 has a bearing surface 459 against which the fingers 346 of the jack 330 abut at mating. The presence of the flex section 454 enables the body 456 and stop 458 to slide axially or flex in response to contact from the fingers 346, thereby providing axial and radial compression for electrical contact as well as providing for potential axial misalignment as discussed above.

Figure 4:
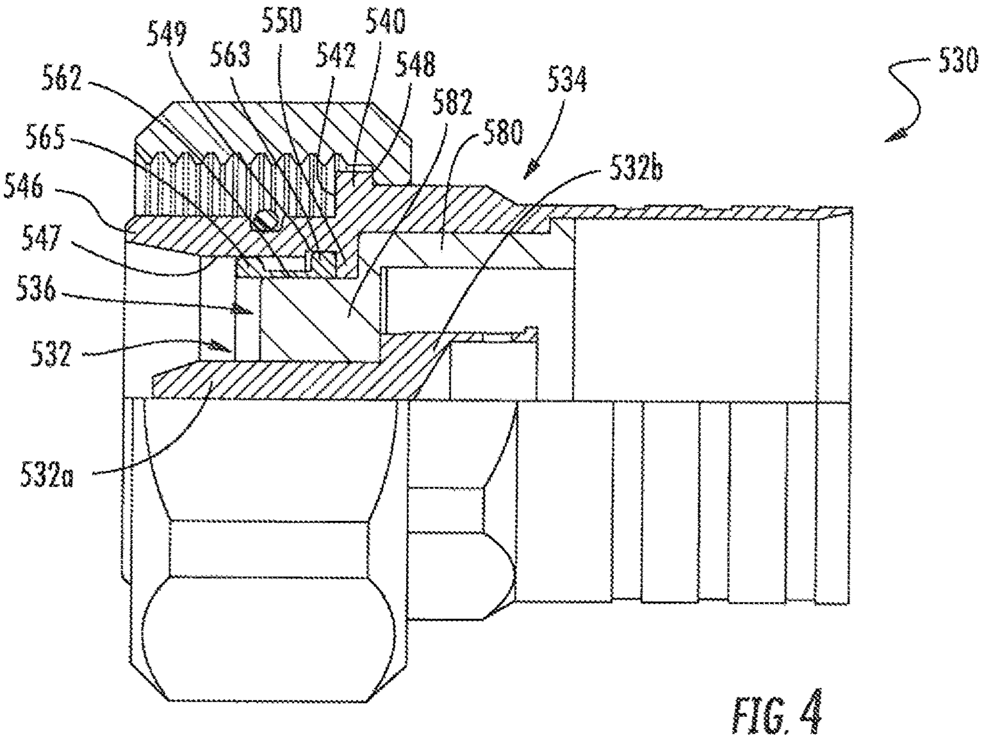
FIG. 4 is a partial section view of a coaxial connector according to additional embodiments of the present invention.
Figure 5:
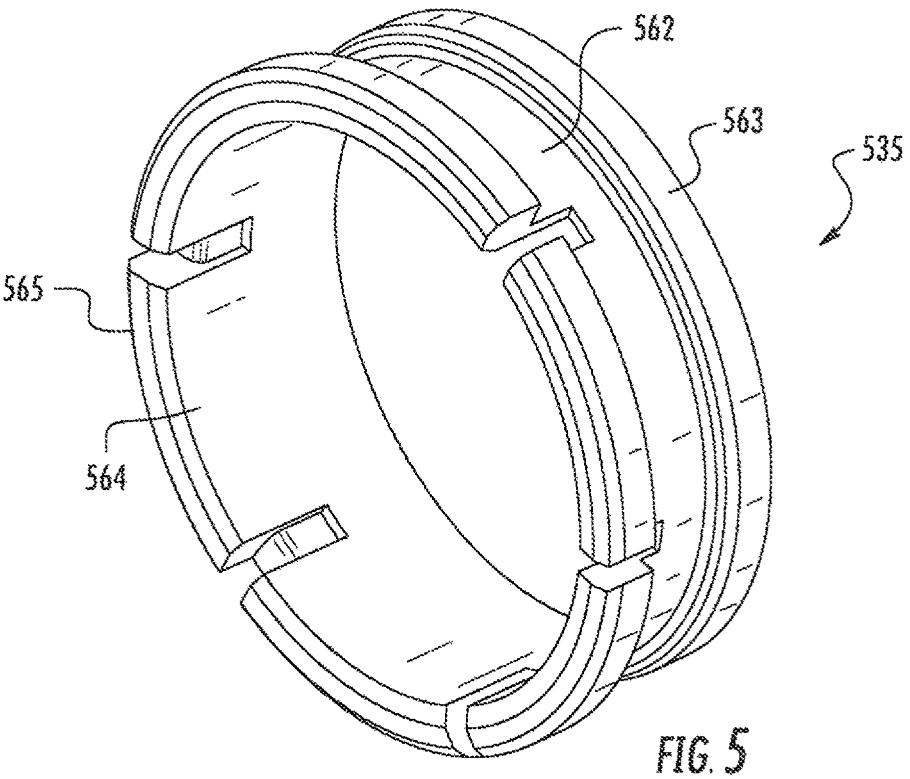
FIG. 5 is a perspective view of an insert for the coaxial connector of FIG. 4.
Figure 6:
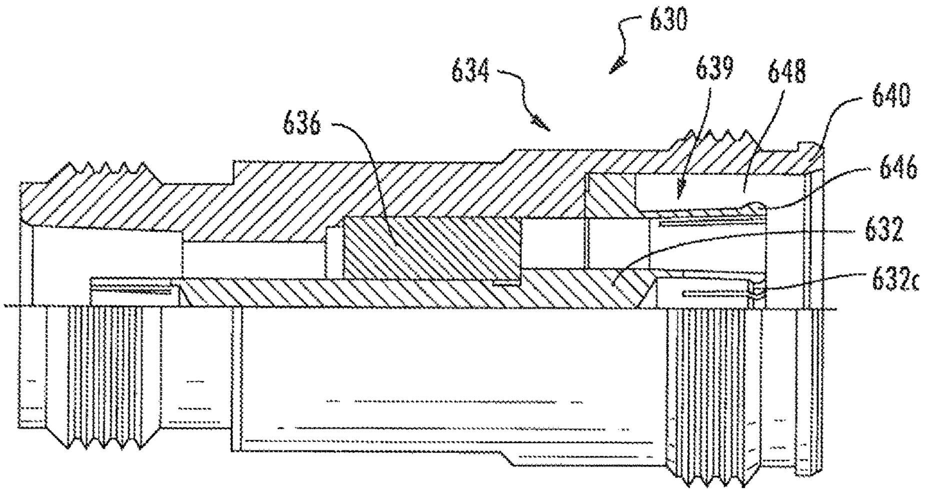
FIG. 6 is a partial section view of a coaxial connector configured to mate with the coaxial connector of FIG. 4.
Figure 7:
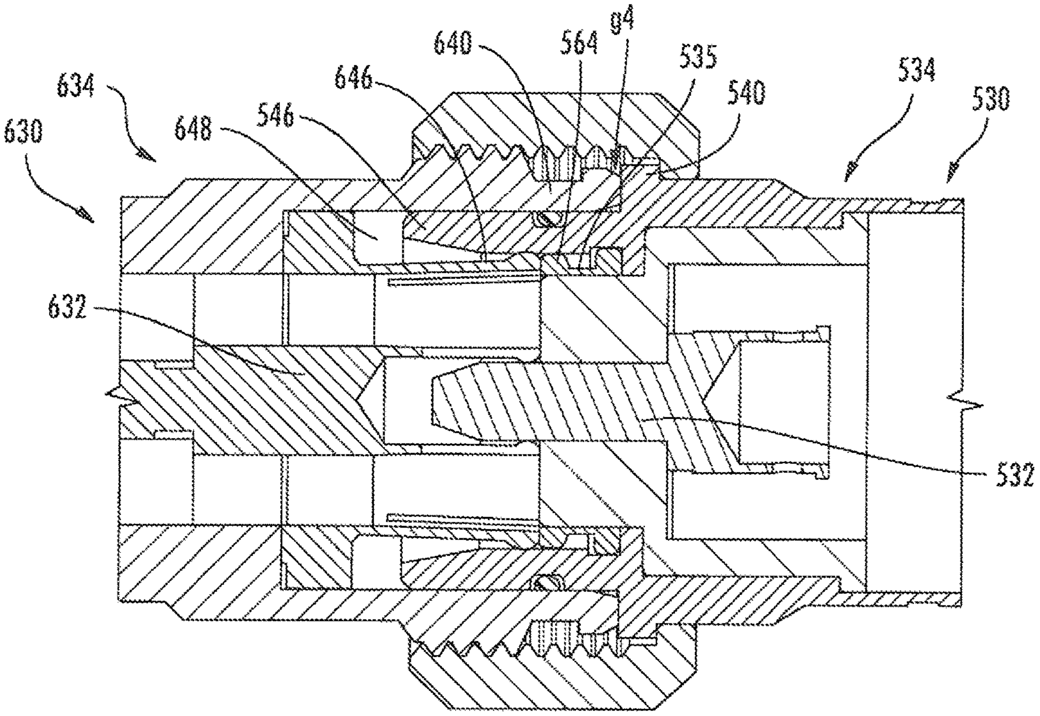
FIG. 7 is a section view of the coaxial connector of FIG. 4 mated with the coaxial connector of FIG. 6.

Further variations of connectors according to embodiments of the present invention are shown in FIGS. 4-7. A plug 530 is shown in FIG. 4, a mating adapter 630 (analogous to the jacks discussed above) is shown in FIG. 6, and the mated plug 530 and adapter 630 are shown in FIG. 7.

The plug 530 includes a central conductor extension 532, an outer conductor extension 534 with an insert 535, and a dielectric spacer 536. The central conductor extension 532 is similar to that described above, with a generally cylindrical post 532*a* with a conical free end and a body 532*b* configured to be attached to the inner conductor of a coaxial cable.

The dielectric spacer 536 is generally annular, but has a stepped profile, with a larger ring 580 and a smaller ring 582. The smaller ring 582 fits over the central conductor extension post 532*a*. The larger ring 580 fits inside the outer conductor extension 534. The shape of the dielectric spacer

536 can be advantageous during the soldering of the outer conductor of the attached coaxial cable to the outer conductor extension 534; this process is described in International Application No. PCT/CN2014/071971, filed Feb. 11, 2014, the disclosure of which is hereby incorporated herein in its entirety.

The outer conductor extension 534 is configured much like the outer conductor extension 234 discussed above. The outer conductor extension 534 has a shoulder 540 that provides a bearing surface 548 that receives the coupling nut 560 and an opposed surface 542. The free end portion 546 of the outer conductor extension has an inner surface 547 with a shallow recess 549 adjacent a projection 550 that extends radially inwardly. One surface of the projection 550 bears axially against the larger ring 580 of the dielectric spacer 536.

The insert 535 (see FIG. 5) is generally annular and includes a body 562 with a rim 563 on one end. Fingers 564 extend axially from the body 562 and terminate with radially outwardly-extending nubs 565. As can be seen in FIG. 4, the rim 563 fits within the recess 549 of the outer conductor extension 534, with the nubs 565 of the fingers 564 contacting the inner surface 547 of the free end portion 546.

Referring now to FIG. 6, the adapter 630 includes an inner conductor extension 632 similar to the inner conductor extension 132 discussed above, with the exception that the end 632*b* has fingers 632*c*. The outer conductor extension 634 is similar to the outer conductor extension 234 above; it includes a free end portion 640, but also includes an separate flex section 639 with fingers 646 that form a gap 648 with the free end portion 640. A dielectric spacer 636 separates the inner conductor extension 632 from the outer conductor extension 634.

FIG. 7 shows the plug 530 mated with the adapter 630. The free end portion 546 of the outer conductor extension 534 fits within the gap 648 between the fingers 646 and the free end portion 640 of the outer conductor extension 634. The fingers 646 deflect to receive the free end portion 546, thereby providing radial contact therebetween. Also, the ends of the fingers 564 of the insert 535 abut the ends of the fingers 646 to provide axial contact, which can cause either or both of the fingers 564, 646 to flex or bow slightly. As with the plug 230 and jack 330, there is a gap g4 between the end of the free end portion 640 of the outer conductor extension 634 and the shoulder 540 of the outer conductor extension 534 as prescribed by 4.3/10 interface guidelines, but both radial and axial contact between the outer conductor extensions 534, 634 are present to enhance electrical performance.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. An assembly of mated coaxial connectors, comprising:

a first connector having a first central conductor extension, a dielectric radially outward of the first central conductor extension, and a first outer conductor extension radially outward of the dielectric, the first outer conductor extension having a free end portion;

a second connector having a second central conductor extension and a second outer conductor extension, the second outer conductor extension having an outer body and an inner body with a gap therebetween;

wherein the first central conductor extension engages the second central conductor extension to establish a first electrical connection;

wherein the free end portion of the first outer conductor extension fits within the gap of the second outer conductor extension, such that the inner body applies radially outward pressure to the first outer conductor extension to establish a second electrical connection; and wherein the first connector further includes an annular insert that resides radially inwardly of the free end portion of the first outer conductor extension and radially outward of the dielectric, the annular insert including a flexible body and a contact surface that engages a free end of the inner body to apply axial pressure thereto.

2. The assembly defined in claim 1, wherein the second outer conductor extension also includes a flex member that deflects during axial engagement.

3. The assembly defined in claim 2, wherein the outer body of the second outer conductor extension does not axially engage the first outer conductor extension.

4. The assembly defined in claim 1, wherein the inner body of the second outer conductor extension includes a plurality of axially-extending fingers, the fingers applying radial pressure to the first outer conductor extension and axial pressure to the contact surface of the annular insert.

5. The assembly defined in claim 4, wherein the second outer conductor extension also includes a flex member that deflects during axial engagement, and wherein the inner body of the second outer conductor extension comprises a radially-extending flex section on which the plurality of axially-extending fingers are mounted, and wherein the flex section serves as the flex member of the second outer conductor extension.

6. The assembly defined in claim 1, wherein the annular insert includes a plurality of fingers, wherein free ends of the fingers provide the contact surface.

7. The assembly defined in claim 6, wherein the fingers contact an inner surface of the free end portion of the first outer conductor extension.

* * * * *